United States Patent [19]

Guha et al.

[11] Patent Number: 5,739,545

[45] Date of Patent: Apr. 14, 1998

[54] ORGANIC LIGHT EMITTING DIODES HAVING TRANSPARENT CATHODE STRUCTURES

[75] Inventors: Supratik Guha, Yorktown Heights; Richard Alan Haight, Mahopac; Joseph M. Karasinski, Yorktown Heights, all of N.Y.; Ronald R. Troutman, Ridgefield, Conn.

[73] Assignee: International Business Machines Corporation, Armonk, N.Y.

[21] Appl. No.: 794,072

[22] Filed: Feb. 4, 1997

[51] Int. Cl.[6] .............................. H01L 35/24; H01L 51/00
[52] U.S. Cl. ........................... 257/40; 257/103; 313/504
[58] Field of Search ........................ 257/40, 103; 313/504

[56] References Cited

U.S. PATENT DOCUMENTS

| 5,349,209 | 9/1994 | Moyer et al. | 257/80 |
| 5,608,287 | 3/1997 | Hung et al. | 313/503 |

OTHER PUBLICATIONS

V. Bulovic et al., Nature, vol. 380, p. 29, 7 Mar. 1996.

*Primary Examiner*—Sara W. Crane
*Attorney, Agent, or Firm*—Stephen S. Strunck

[57] ABSTRACT

Organic light emitting diodes having a transparent cathode structure is disclosed. The structure consists of a low work function metal in direct contact with the electron transport layer of the OLED covered by a layer of a wide bandgap semiconductor. Calcium is the preferred metal because of its relatively high optical transmissivity for a metal and because of its proven ability to form a good electron injecting contact to organic materials. ZnSe, ZnS or an alloy of these materials are the preferred semiconductors because of their good conductivity parallel to the direction of light emission, their ability to protect the underlying low work function metal and organic films and their transparency to the emitted light. Arrays of these diodes, appropriately wired, can be used to make a self-emissive display. When fabricated on a transparent substrate, such a display is at least partially transparent making it useful for heads-up display applications in airplanes and automobiles. Such a display can also be fabricated on an opaque substrate, such as silicon, in which previously fabricated devices and circuits can be used to drive the display.

30 Claims, 9 Drawing Sheets

ORGANIC LIGHT EMITTING DIODES HAVING TRANSPARENT CATHODE STRUCTURES

FIELD OF THE INVENTION

The general field of this invention is that of electroluminescent diodes. More particularly, this invention relates to a transparent cathode structure for organic light emitting diodes which, when fabricated on a transparent substrate, renders a display which is at least partially transparent and when fabricated on an opaque substrate containing devices and circuits renders a display viewable from the cathode side.

BACKGROUND OF THE INVENTION

Organic light emitting diodes (OLEDs) described in prior work were fabricated on glass substrates, and their lower electrode was the transparent conductor indium tin oxide (ITO). The top electrode for these devices was opaque so that light from the electroluminescent region could be viewed only from the glass side. One exception is the structure recently reported by V. Bulovic et al. in Nature 380, 29 (1996) in which the cathode metal is thinned during the subsequent ITO deposition and made partially transparent.

An OLED display on an opaque substrate or a transparent OLED display on a transparent substrate requires a top electrode structure that satisfies the following criteria: (1) be transparent to the LED emission, (2) provide a low series resistance current injection into the LED active region, (3) provide sufficiently high lateral conductivity in the plane of the electrode when these diodes are formed into two-dimensional arrays to make self-emissive displays, (4) act as a protective film to the chemically and physically delicate underlying organic film, and (5) be able to be deposited in a benign fashion without damaging the organic layer on which it is deposited so that the integrity of the organic layer/electrode interface is preserved. The common transparent electrode material indium tin oxide (ITO), often used as an anode in OLEDs, satisfies requirements 1–4, but it is typically deposited in an oxygen plasma ambient that causes damage to the organic region in the OLED device structure and therefore does not satisfy (5). The same is true for GaN as an electrode. Criterion (5) is actually the most crucial since, although there are several transparent conductive materials, nearly all involve plasmas or high processing temperatures which irreversibly damage the organic light emitting material.

What is needed is a transparent cathode structure that is convenient to make and satisfies all of the above requirements.

SUMMARY

This invention provides organic light emitting diodes (OLEDS) having a transparent cathode formed on either transparent or opaque substrates. This cathode consists of a thin film of a low work function metal (such as calcium) covered by a wide bandgap semiconductor (such as ZnSe). Both components can be thermally evaporated in the same system used to deposit the organic films without damaging them chemically or physically. The wide bandgap semiconductor protects both the organic films and the low work function (and reactive) metal film during subsequent deposition of other materials such as ITO, which can be added to increase lateral conductivity. The thin metal film determines the electron injection efficiency and prevents the ZnSe from diffusing into the organic electroluminescent layer.

BRIEF DESCRIPTION OF THE DRAWINGS

The above and other advantages of this invention will become more apparent from the following description taken in conjunction with the accompanying drawings, in which.

DETAILED DESCRIPTION

Figure 1:
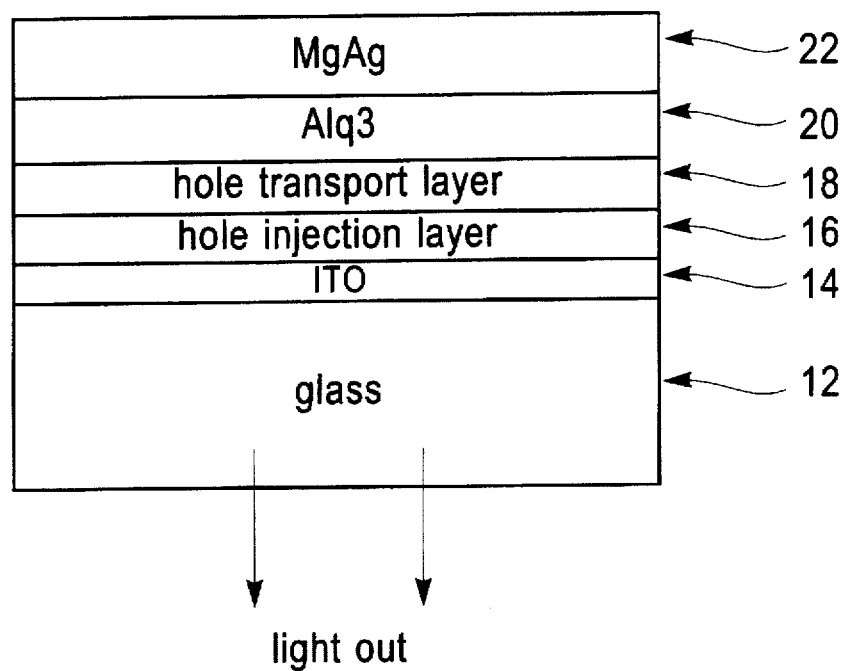
FIG. 1 shows a prior art OLED structure on a glass substrate with an opaque metal cathode on top wherein light is emitted from the glass side only.

An example of the structure of a prior art OLED 10 is shown in FIG. 1. The substrate 12 is glass, and an ITO film 14 is deposited directly on the glass and patterned to form an anode. For efficient operation the organic region commonly consists of several layers and shown in FIG. 1 are a hole injection layer 16, a hole transport layer 18 and an electroluminescent (EL) layer 20, which doubles as an electron transport layer. EL layer 20 is the metal chelate tris(8-hydroxyquinoline) aluminum, (sometimes abbreviated Alq or Alq3), and the hole transport layer is an aromatic diamine. The metal alloy MgAg is deposited on top of the organics to form a cathode 22 which is opaque for thicknesses greater than approximately 10 nm. Not shown is a hermetic seal that is sometimes used to protect the cathode from moisture.

The EL layer in the structure of FIG. 1 is a member of the class of organic materials known as molecular organics because they can be thermally evaporated as molecules. Polymers form another class of organic materials exhibiting electroluminescence and are usually applied by spin coating. Polymer OLEDs also are commonly made on glass substrates using an ITO anode and have an opaque cathode (usually a low work function metal such as calcium) so that light is emitted from the glass side only. They may also employ multiple polymer layers to improve operating efficiency.

Figure 2:
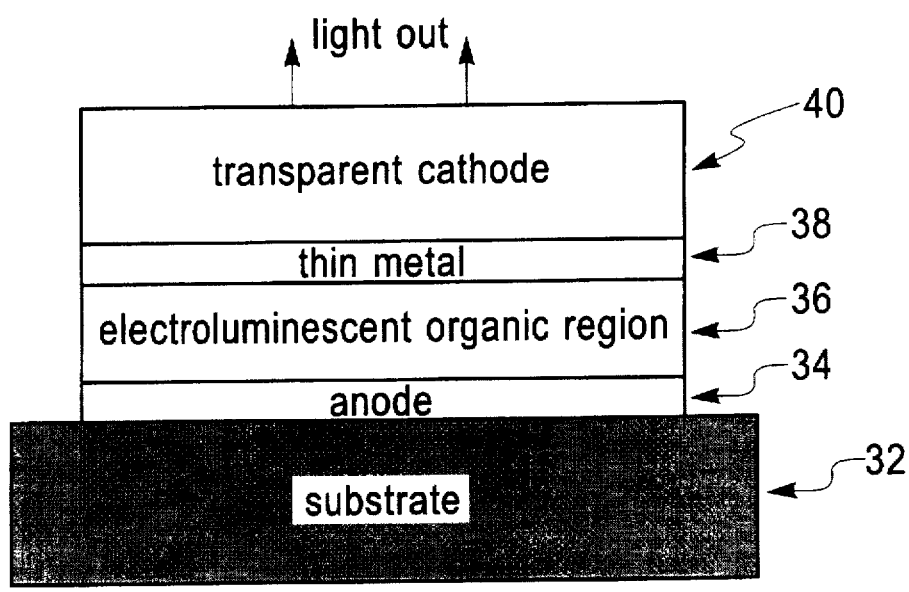
FIG. 2 generally shows the OLED structure of the invention with a transparent (or opaque) cathode.

The basic embodiment of this invention is an OLED having a transparent cathode 40 which is depicted by the general structure in FIG. 2. If the OLED is formed on a glass substrate 32 with an ITO anode 34, as in the prior art, light is now emitted from both sides, and the OLED is at least partially transparent. A viewer looking at a display consisting of an array of such OLEDs could either focus on the image presented on the display or could look through the display at the scene beyond. On the other hand, a display formed on an opaque substrate, such as silicon, and using OLEDs with a transparent cathode could be viewed by looking at the light emitted from the cathode side. Fabricating an OLED display on silicon is advantageous because the devices and circuits can be formed in the silicon prior to depositing the OLED on the silicon, and these devices and circuits can be used to make an active matrix display with integrated drivers.

Figure 3:
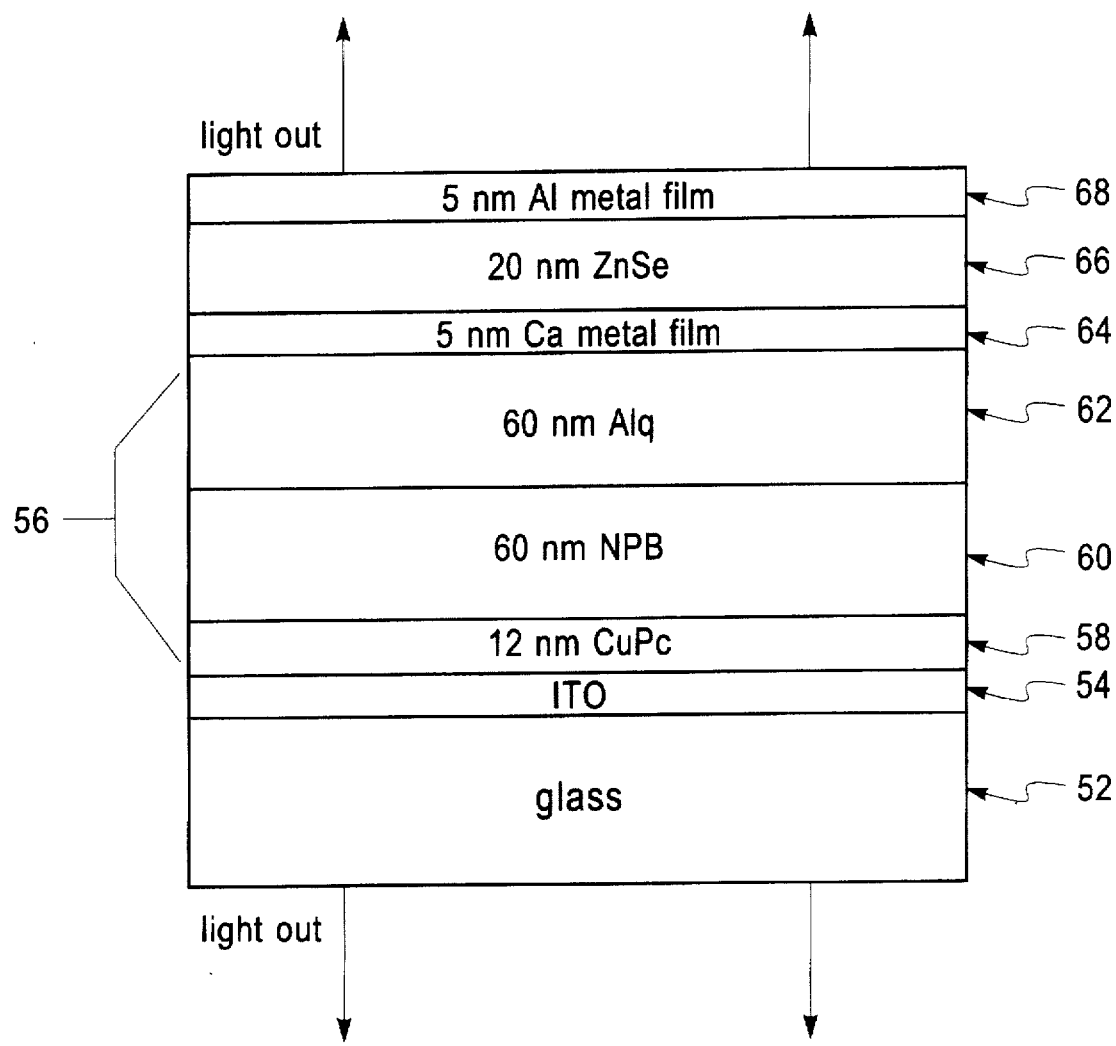
FIG. 3 shows an OLED device of the invention with a Ca/ZnSe cathode and a thin partially transparent aluminum top layer.

FIG. 3 shows the cross section of an OLED device 50 of the invention with a Ca/ZnSe cathode. ITO anode 54 has been deposited on glass substrate 52. The organic stack 56 consists of three organic films, all thermally evaporated: 12 nm of copper phthalocyanine (CuPc) 58, followed by 60 nm of the diamine NPB (4,4'-Bis [N-(1-naphthyl)-N-phenylamino]-biphenyl) 60, followed by 60 nm of Alq 62. The thin (5 nm) calcium film 64 and the ZnSe film 66 (20 nm) are thermally evaporated in the same chamber as the organic stack 56. In this device a thin (5 nm) Al film 68, also thermally evaporated, was used to connect the cathode structure to an ITO pad (not shown), which served as a contact to the power supply.

As we have demonstrated, light emission from an OLED of this invention having the cross section shown in FIG. 3 is from both the top and the bottom (i.e., from both sides of the diode) since both anode and cathode are transparent.

Figure 4:
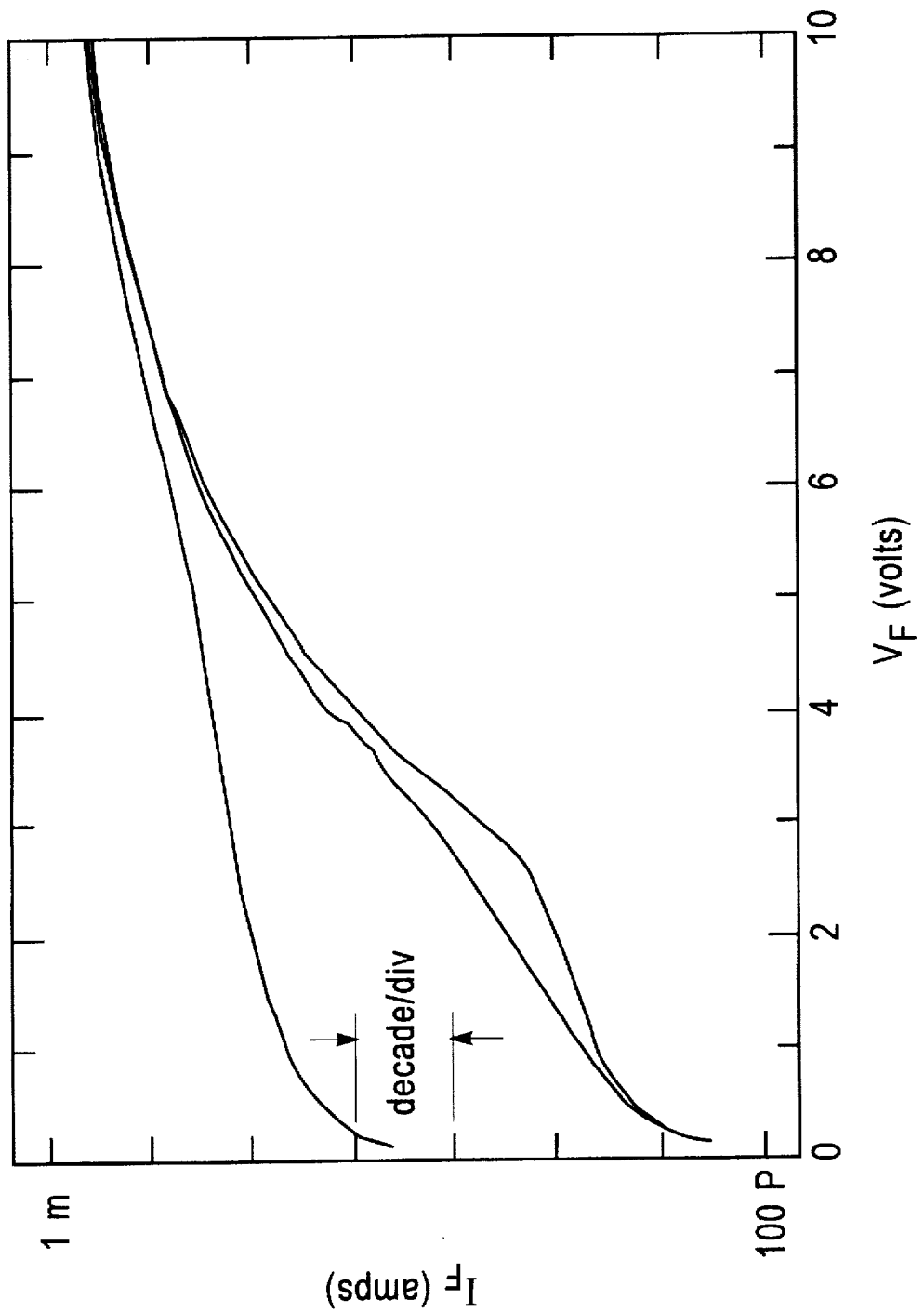
FIG. 4 is a graph of the electrical characteristics for three different diodes having the structure shown in FIG. 3.

FIG. 4 shows the current vs voltage characteristic as increasing voltage is applied across the diode. Data is shown for three different diodes, one of which has high leakage current. The characteristics tend to saturate at high forward bias because of series resistance and space charge effects from high level injection.

We have found that the Ca/ZnSe stack provides a satisfactory cathode electrode by meeting the requirements of transparency, perpendicular conduction for low series resistance, formation of a protective film and a damage free deposition process. Below, each requirement is considered individually.

(1) Transparency to LED Light Emission

Generally, wide band gap semiconductors from the family of compounds constituted from column two and column six elements of the periodic table are suitable for use in the OLEDS of the invention. In particular, ZnSe has a band-gap of 2.7 eV and is therefore transparent to emission wavelengths down to about 460 nm. Thus, pure ZnSe with a thickness of 10–20 nm is adequate for red, green and blue LEDs in terms of transparency. The system $ZnS_xSe_{1-x}$ where the band gap can be varied from 2.7–3.7 eV, may be used for violet or ultra-violet LEDs.

(2) Damage Free Deposition Process

Organic materials such as the ones used in OLEDs are especially sensitive to gas plasmas and discharges in terms of physical and chemical damage. As mentioned earlier, this precludes the deposition of ITO or GaN directly onto the organic surface. Plasma deposition of these materials can lead to electrical shorts or to the formation of dark spots, regions within the OLED where light is not emitted. On the other hand, both Ca and ZnSe can be deposited by thermal evaporation in a high vacuum chamber. No gas plasmas are required and the process is thus benign to the organic surface on which the deposition takes place. A damage free organic/electrode interface is thus preserved. Typically the ZnSe has to be heated up to about 750–800 C. for adequate evaporation and if the source is kept suitably far away from the Alq substrate, radiative heating of the substrate is negligible. To prevent thermal damage to the Alq, ZnSe deposition has to be carried out with the substrate at room temperature. This results in the formation of a ZnSe film with a columnar microstructure. If necessary, the ZnSe can also be doped with Cl using thermally evaporated $ZnCl_2$. In this case, the $ZnCl_2$ is heated to about 220 C. ZnSe or, more generally, the alloyed wide bandgap semiconductor $ZnS_xSe_{1-x}$ can thus be deposited without damage to Alq or Alq/Ca surfaces of OLEDs and the process is thus benign.

(3) Achieving High Parallel and Perpendicular Conductivity

As is the case for low temperature deposited films, it is expected that room temperature deposition of ZnSe will result in a polycrystalline microstructure with columnar grains perpendicular to the film surface. We have found that room temperature deposited ZnSe has a very high resistivity (>1000 ohm-cm) parallel to the thin film surface, as measured by a 4 point probe. On the other hand, the film is conducting in a direction perpendicular to the film surface (and parallel to the columnar grains). To establish this fact, a 200 nm film of ZnSe, doped with $ZnCl_2$ was grown on a Si substrate coated with a 200 nm film of Al. Once the ZnSe film was deposited, 0.5 mm dots of Al, 200 nm thick were deposited and the resistance through the ZnSe film was measured, indicating that the series resistance of a still thinner film grown on the organic stack as part of an OLED structure would be negligible. Indeed, when a 20 nm film of ZnSe was grown on 5 nm of Ca atop an organic stack, little light emission was observed owing to the poor lateral conductivity of ZnSe. When an additional semi-transparent 5 nm film of At was deposited atop the ZnSe/Ca stack, the high lateral conductivity of the Al, combined with the high perpendicular conductivity of the ZnSe resulted in brightly lit diodes with light emission beginning at only 3 volts. These results point to the exceptionally anisotropic conductivity of the ZnSe films, which has been shown for other materials such as ZnO.

Figure 5A:
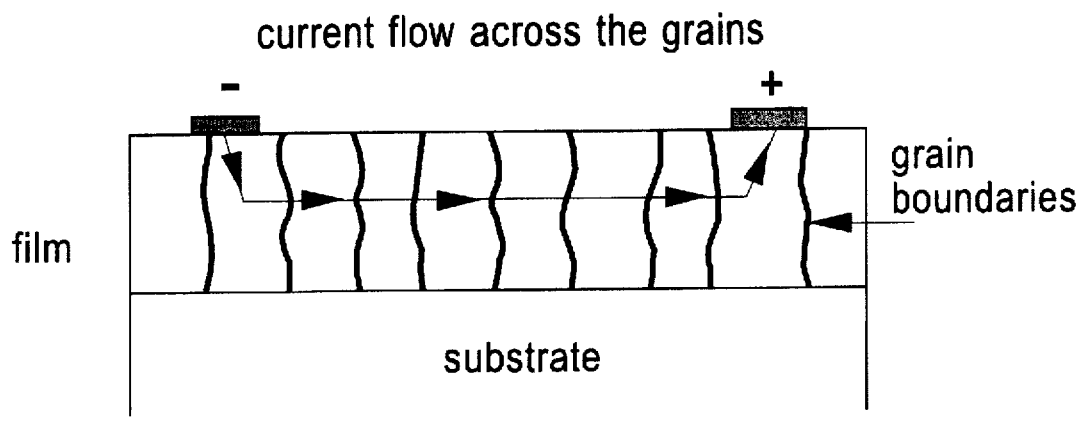
FIG. 5A shows schematically electrical conduction along the film for a columnar polycrystalline microstructure and 5B shows electrical conduction perpendicular to the film thickness for the same microstructure.
Figure 5B:
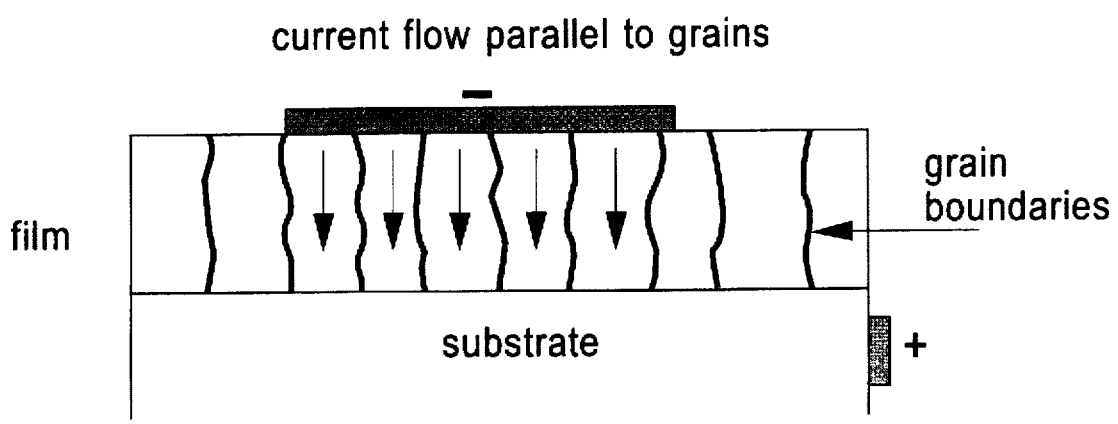

In the case of a polycrystalline microstructure, the resistance offered by the material consists of two components: (i) the resistance due to the grain boundaries ($R_{gb}$) and (ii) the resistance due to the bulk film ($R_{bulk}$). For semiconductors, due to the high disorder in the grain boundaries, carrier mobilities are very low and thus $R_{gb}$ is typically much larger than $R_{bulk}$. In the case of a columnar microstructure with the columns perpendicular to the thin film surface, as is the case typically for deposited polycrystalline thin films, if conduction parallel to the surface is considered, then the net resistance $R=R_{bulk}+R_{gb}$, since the conduction is across the grains (FIG. 5A). Typically, resistance across a grain boundary can be quite high, resulting in very poor conductivity in this direction. On the other hand, if the conduction is perpendicular to the surface (parallel to the ZnSe columns, as indicated in FIG. 5B), then the net resistance $R=R_{bulk}R_{gb}/(R_{bulk}+R_{gb})$. For the case of $R_{bulk}<<R_{gb}$ the net resistance $R \approx R_{bulk}$, resulting in a low resistance path in this direction. This appears to be the present case. The low perpendicular resistivity thus allows ZnSe to be a good perpendicular current injector with low series resistance while at the same time maintaining a mechanically and chemically undamaged ZnSe/OLED interface. In addition, the conduction band of the ZnSe and the lowest unoccupied molecular orbital (LUMO) of the Alq are nearly in alignment, resulting in barrierless injection from the ZnSe into the Alq. Injection of electrons from the ZnSe into the Alq is also assisted by the 5 nm Ca layer, which serves multiple purposes. The calcium acts as a diffusion barrier, preventing the deposited ZnSe from diffusing into the rather porous Alq. It also acts as an adhesion layer since its reactive nature results in a layer which reacts strongly with the Alq on one side and the ZnSe film on the other. Finally, the low 2.9 eV work function of the Ca enhances electron injection from the ZnSe into the Alq layer.

Figure 6:
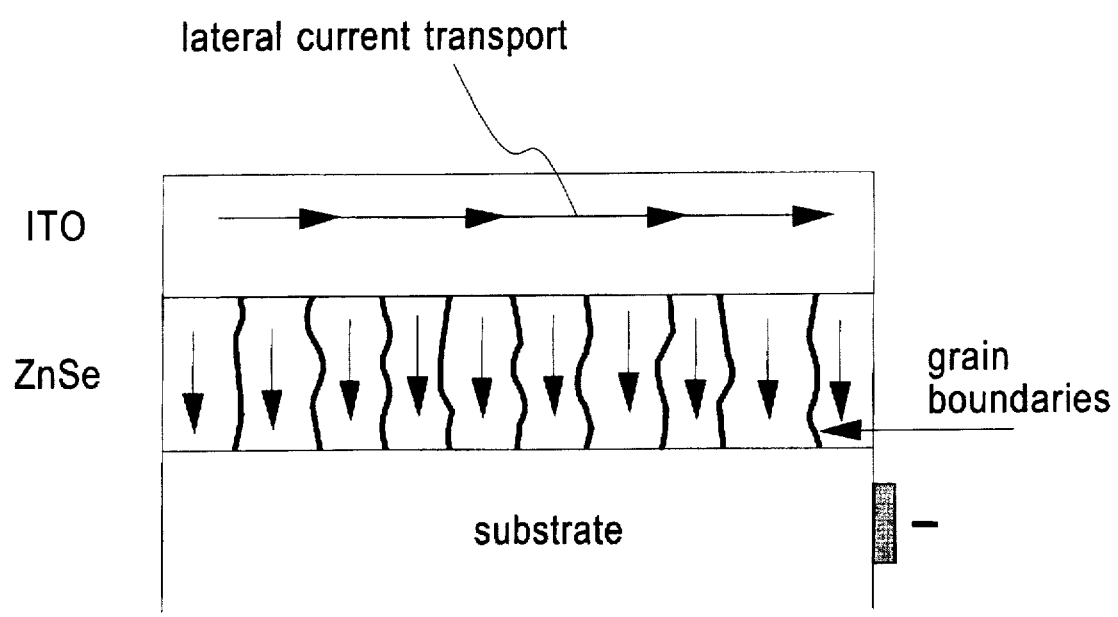
FIG. 6 shows schematically high lateral and perpendicular electrical conduction in an ITO/ZnSe stack.

Following 10–20 nm of ZnSe deposition, a metal layer thin enough to insure partial transparency or a thick ITO layer may be deposited to provide the lateral conductivity across the diode. The latter case is shown in FIG. 6. Such a stack thus provides both parallel and perpendicular conductivity. The presence of the protective ZnSe prevents damage to the underlying organics during the metal or ITO deposition.

(4) Formation of a Protective Film

The ZnSe film is protective in two respects. Firstly, it protects the underlying organic layers from plasma damage during subsequent metal or ITO deposition. The 10–20 nm ZnSe thickness is adequate for that purpose. Secondly, ZnSe deposition in the manner described above results in a layer that is uniform and non-porous in nature. It therefore acts as a good barrier to contamination from the ambient which is highly desirable since the organic materials are moisture sensitive.

Figure 7:
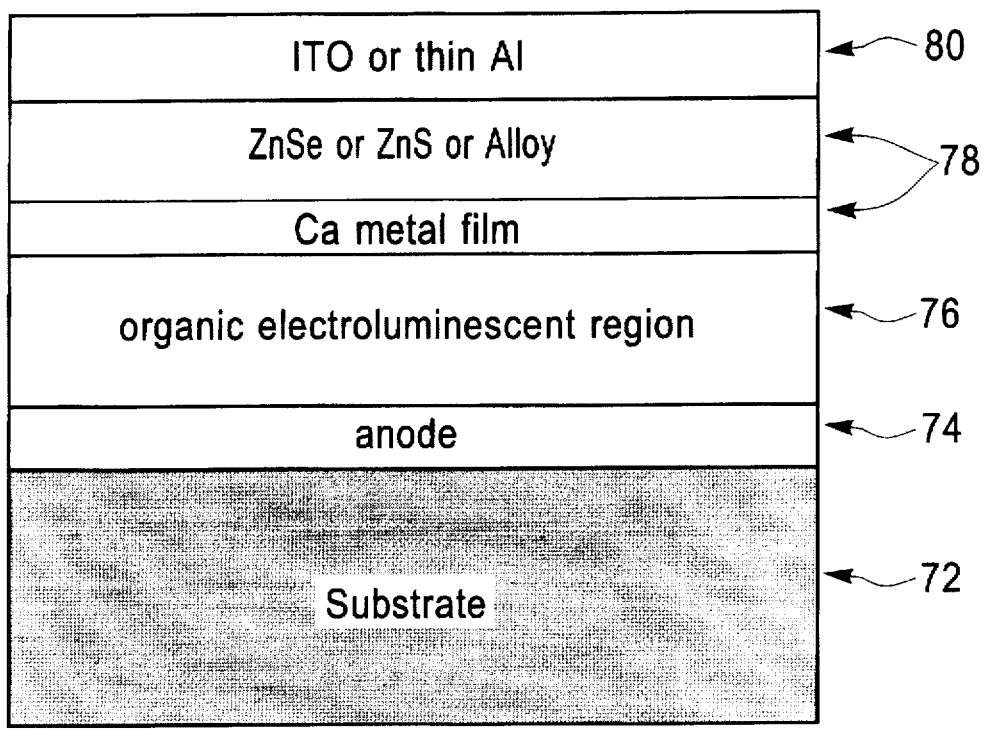
FIG. 7 shows schematically a generalized OLED structure of the invention.

FIG. 7 summarizes the general structure of an OLED 70 of this invention with a transparent or opaque substrate 72, high work function anode 74, organic electroluminescent region 76 comprised of a single or multiple layers, a transparent cathode 78 consisting of a thin Ca metal film, a layer of ZnSe, ZnS or an alloy of these materials and a conductive top layer 80 of ITO.

Figure 8A:
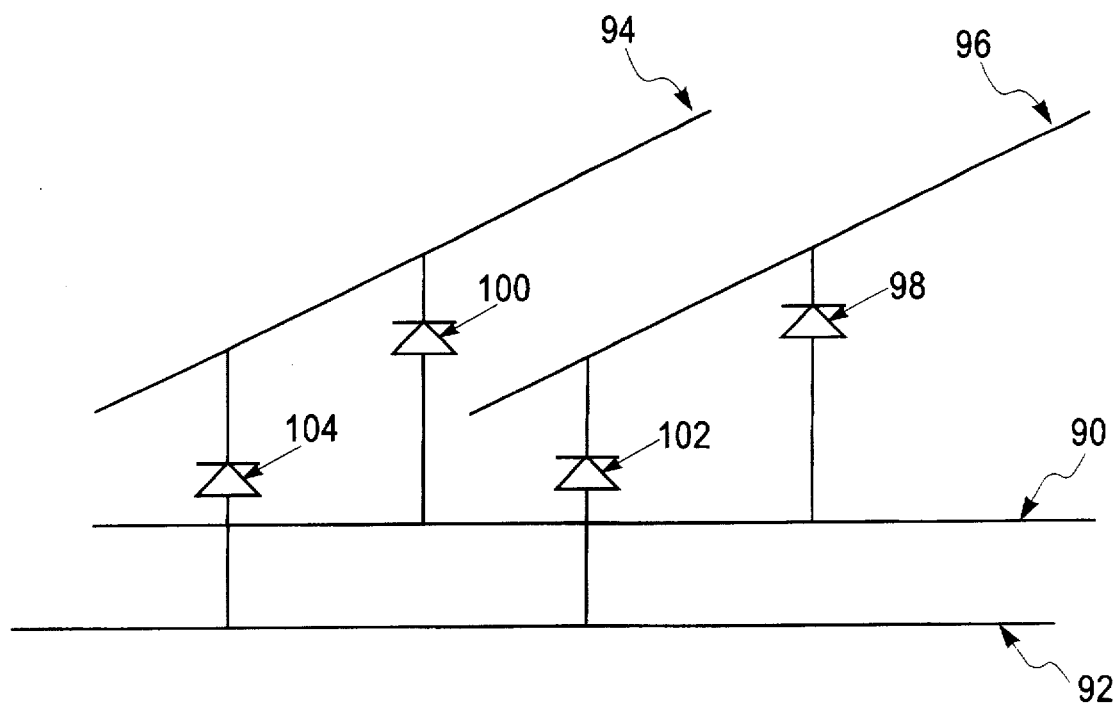
FIG. 8 shows schematically OLED arrays for displaying an image with FIG. 8A being that of a passive matrix having an OLED at the crosspoint of each row and column line and FIG. 8B being that of an active matrix with a current regulating circuit at the crosspoint of each row and column line.

A display device is formed by fabricating many identical OLEDs on a monolithic substrate arranged into a two-dimensional array and providing the means of controlling the light emission from each diode. Generally, the image is formed a line at a time. In FIG. 8A (passive matrix approach), for example, the selected row line 90 is brought to a positive voltage Vr while all unselected row lines 92 remain at ground. A voltage Vci is applied to each column line 94, 96 where i is the column line index and runs from 1 to the maximum number of column lines. The forward bias on OLEDs 98, 100 along the selected row line 90 is then Vr-Vol and this voltage determines the amount of light emitted. All other OLEDs 102, 104 are reverse biased and emit no light.

Figure 8B:
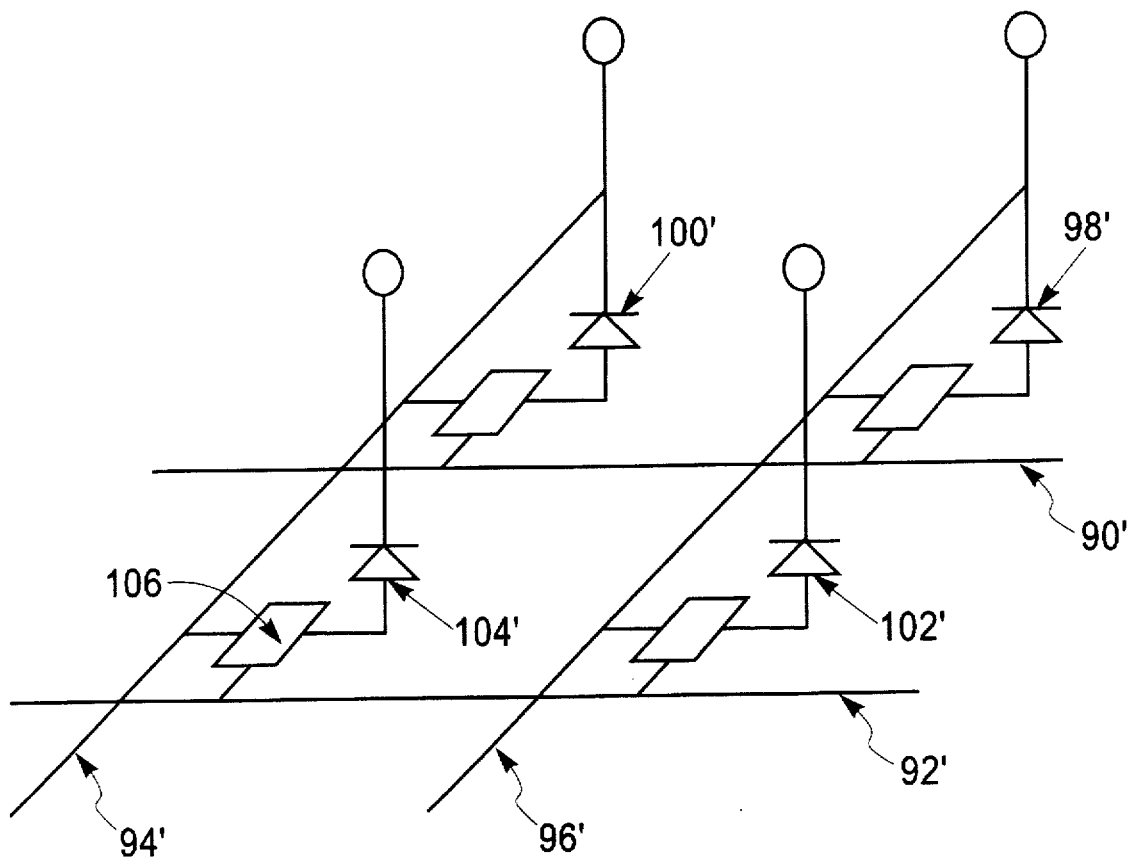

For the array shown in FIG. 8A, an OLED emits light only when its row line is accessed and this can produce flicker in high information content displays. This is remedied by the array shown in FIG. 8B (active matrix approach) where a circuit 106 included at each cross point is used to sample the column line voltage and hold it while the other row lines are accessed. In this case all diodes share a common cathode. Because these circuits need to be small and fast, it is convenient to fabricate them in single crystal silicon. In this second case, the substrate is opaque and a transparent cathode is required to view the image.

The technical papers and other references cited above are hereby incorporated herein by reference.

While this invention has been described in terms of preferred embodiments thereof, it will be appreciated by those having skill in the art that variations may be made in the invention without departing from the spirit and scope of the invention. For example, other materials could be used or developed as substitutes for those noted, and different assembly techniques and procedures could be employed. Accordingly, the scope of the invention is to be limited only by the following claims.

What is claimed is:

1. An organic light-emitting diode consisting of, in sequence, a substrate, an anode structure, an organic electroluminescent region, and a cathode structure, the cathode structure further consisting of a thin metal layer in direct contact with the organic medium and covered by a protective layer of a wide bandgap semiconductor.

2. The diode of claim 1 having an additional conductive layer on top of the wide bandgap semiconductor, said additional conductive layer consisting of a non-reactive metal layer.

3. The diode of claim 2 wherein said metal of said non-reactive metal layer is aluminum.

4. The diode of claim 1 having an additional conductive layer on top of the wide bandgap semiconductor, said additional conductive layer consisting of a transparent conductive material.

5. The diode of claim 4 wherein said conductive material is indium tin oxide.

6. The diode of claim 4 wherein said conductive material is aluminum doped zinc oxide.

7. The diode of claim 1 in which the thin metal layer of the cathode structure is a low work function metal.

8. The diode of claim 7 wherein said low work function metal is calcium.

9. The diode of claim 1 in which the thin metal layer of the cathode structure is an alloy of two or more metals containing at least one low work function metal.

10. The diode of claim 9 wherein said alloy is an alloy of magnesium and silver.

11. The diode of claim 1 in which the wide bandgap semiconductor is from the family of compounds constituted from from the column two and column six elements of the periodic table.

12. The diode of claim 11 in which the wide bandgap semiconductor is a semiconductor selected from the group consisting of ZnSe, ZnS, and $ZnS_xSe_{1-x}$.

13. The diode of claim 12 wherein said $ZnS_xSe_{1-x}$ is n-type doped.

14. The diode of claim 12 wherein said $ZnS_xSe_{1-x}$ is p-type doped.

15. The diode of claim 1 wherein said anode is a transparent conductor.

16. The diode of claim 15 wherein said conductor is indium tin oxide.

17. The diode of claim 1 in which said anode is a high work function metal.

18. The diode of claim 17 wherein said metal is a metal selected from the group consisting of nickel, platinum and palladium.

19. The diode of claim 1 in which said anode is an alloy of two or more metals containing at least one high work function metal.

20. The diode of claim 1 in which the organic electroluminescent region consists of a single organic electroluminescent layer.

21. The diode of claim 1 in which the organic electroluminescent region consists of a a stack of organic layers including at least one electroluminescent layer and an electron transporting layer wherein said thin metal layer is in direct contact with the electron transporting layer.

22. The diode of claim 1 in which the substrate is transparent.

23. The diode of claim 1 in which the substrate is semi-transparent.

24. The diode of claim 1 in which the substrate is opaque.

25. The structure of claim 1 in which the material of said substrate is one selected from the group consisting of glass, plastic, and silicon.

26. The structure of claim 1 in which the substrate is flexible.

27. An array consisting of more than one claim 1 organic light emitting diode.

28. The array of claim 27 in which the same electrodes for all OLEDs along a row are electrically connected together and the opposite electrodes for all OLEDs along a column am electrically connected together so that each OLED is selected by applying a voltage to one row line and one column line.

29. The array of claim 27 for which the substrate of the claim 1 diodes is single crystal silicon in which circuits have been formed prior to the formation of the array.

30. The array of claim 29 in which said circuits control the light emitted from each of the OLEDs in the array.

* * * * *